United States Patent
Li et al.

(10) Patent No.: US 8,129,982 B2
(45) Date of Patent: Mar. 6, 2012

(54) VOLTAGE SENSING CIRCUITS AND METHODS FOR INVERTERS

(75) Inventors: Youling Li, Shenzhen (CN); Yingpeng Hu, Shenzhen (CN); Xiaojun Wang, Shenzhen (CN)

(73) Assignee: O2Micro International Limited, Grand Cayman (KY)

( * ) Notice: Subject to any disclaimer, the term of this patent is extended or adjusted under 35 U.S.C. 154(b) by 479 days.

(21) Appl. No.: 12/489,033

(22) Filed: Jun. 22, 2009

(65) Prior Publication Data

US 2009/0256490 A1 Oct. 15, 2009

Related U.S. Application Data

(63) Continuation of application No. 12/072,827, filed on Feb. 28, 2008, now Pat. No. 7,554,319.

(51) Int. Cl.
*G01R 13/20* (2006.01)
(52) U.S. Cl. .............. 324/121 R; 324/123 R; 324/126; 315/308
(58) Field of Classification Search .......... None
See application file for complete search history.

(56) References Cited

U.S. PATENT DOCUMENTS

| 6,700,331 | B2 | 3/2004 | Benensohn |
| 6,812,623 | B2 * | 11/2004 | Takeda et al. ............ 310/359 |
| 2005/0242789 | A1 | 11/2005 | Kang et al. |
| 2007/0252533 | A1 | 11/2007 | Ger et al. |
| 2008/0080216 | A1 | 4/2008 | Ger et al. |

FOREIGN PATENT DOCUMENTS

| CN | 1388618 A | 1/2003 |
| CN | 1794894 A | 6/2006 |

OTHER PUBLICATIONS

English Translation of Abstract of CN1794894.
English Translation of Abstract of CN1388618.

* cited by examiner

*Primary Examiner* — Minh N Tang

(57) ABSTRACT

A voltage sensing circuit includes a voltage divider and a voltage rectifier. The voltage divider divides a first output voltage on a first output voltage line to a first divided output voltage. The voltage divider comprises a first metal foil and a first capacitor. The first metal foil and the first output voltage line can form a first capacitive component. The first capacitive component is coupled in series with the first capacitor. The first capacitive component and the first capacitor can generate the first divided output voltage. The voltage rectifier is coupled to the voltage divider and can rectify the first divided output voltage to a sensing voltage indicative of the first output voltage.

20 Claims, 5 Drawing Sheets

VOLTAGE SENSING CIRCUITS AND METHODS FOR INVERTERS

RELATED UNITED STATES PATENT APPLICATION

This application is a Continuation Application of the commonly-owned U.S. patent application Ser. No. 12/072,827, filed on Feb. 28, 2008, now U.S. Pat. No. 7,554,319, by Youling Li et al., and entitled "Circuits and Methods For Voltage Sensing".

BACKGROUND

Cold cathode fluorescent lamps (CCFLs) are used as inexpensive light units in electrical devices. Both liquid crystal display (LCD) monitors (e.g., single-lamp LCD monitors, and multiple-lamp LCD monitors) and liquid crystal display televisions (LCD TV) can use CCFLs as a backlight because the relatively high illumination efficiency of the CCFL. A CCFL inverter is a device for providing a driving power to one or more CCFLs. However, the drive power is of high voltage. At the moment of a start-up of the CCFL, the driving power can raise to over 1800 volt. As a result, a crisis situation (e.g., striking fire) may occur and it can be dangerous without sensing the drive power.

As such, an over-voltage protection is necessary to help avoid the crisis situation. Conventionally, a sensing voltage can be monitored by the CCFL inverter. The sensing voltage is proportional to the driving power. The CCFL inverter senses the sensing voltage instead of the driving power. A high-voltage capacitance divider or a high-voltage resistance divider is usually used to convert the drive power to a sensing voltage that is within a safe range of the CCFL inverter so that the CCFL inverter can sense the sensing voltage safely. However, the high-voltage capacitance divider and the high-voltage resistance divider can be costly. Furthermore, the high-voltage capacitance divider and the high-voltage resistance divider respectively include a high-voltage capacitor and a high-voltage resistor which can cause high temperature. In addition, the high-voltage capacitor usually has a high capacitance which may cause high leakage current, thereby resulting in current unbalance. As a result, the CCFL inverter may not function stably and the lifetime of the CCFL inverter may be shortened.

SUMMARY

Embodiments in accordance with the present invention provide circuits and methods for sensing an output voltage of a power system. In one embodiment, a voltage sensing circuit comprises a voltage divider and a voltage rectifier. The voltage divider divides a first output voltage on a first output voltage line to a first divided output voltage. The voltage divider comprises a first metal foil and a first capacitor. The first metal foil and the first output voltage line can form a first capacitive component. The first capacitive component is coupled in series with the first capacitor. The first capacitive component and the first capacitor can generate the first divided output voltage. The voltage rectifier is coupled to the voltage divider and can rectify the first divided output voltage to a sensing voltage indicative of the first output voltage.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Reference will now be made in detail to embodiments of the present invention. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
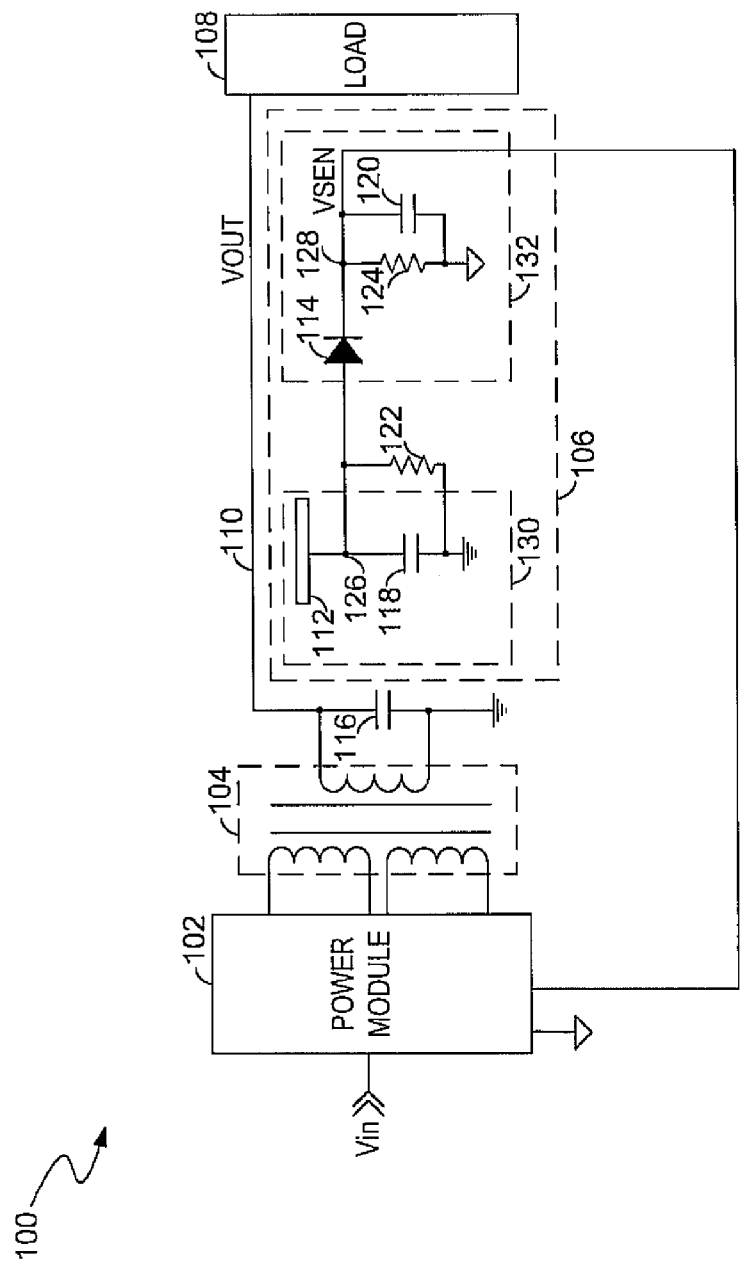
FIG. 1 is a schematic diagram of a power system according to one embodiment of the present invention.

FIG. 1 illustrates a power system 100 according to one embodiment of the present invention. The power system 100 includes a power module 102, a transformer 104, a voltage sensing circuit 106, a load 108, an output voltage line 110, and a capacitor 116. The power system 100 can be a backlight inverter system for driving at least one light source, e.g., a cold cathode fluorescent lamp (CCFL). The power module 102, e.g., an inverter module 102, provides a driving power to the transformer 104, in one embodiment. The transformer 104 transforms the driving power from a relatively low voltage level to a relatively high voltage level. The capacitor 116 regulates the transformed driving power. As such, an output voltage VOUT is generated on the output voltage line 110. The output voltage line 110 provides the output voltage VOUT to the load 108, for example, a CCFL. The voltage sensing circuit 106 generates a sensing voltage VSEN according to the output voltage VOUT and feeds the sensing voltage VSEN back to the inverter module 102, in one embodiment. As such, the inverter module 102 can control the power system 100 according to the sensing voltage VSEN.

In accordance with one embodiment of the present invention, the voltage sensing circuit 106 includes a voltage divider 130, a voltage rectifier 132, and a resistor 122. The voltage divider 130 can divide the output voltage VOUT at the output voltage line 110 to a divided output voltage. The voltage rectifier 132 can rectify the divided output voltage to provide the sensing voltage VSEN. The voltage divider 130 includes a metal foil 112 and a capacitor 118, in one embodiment. The metal foil 112 is placed in parallel with the output voltage line 110. The capacitor 118 is connected to the metal foil 112. The resistor 122 is coupled in parallel with the capacitor 118. In one embodiment, the transformer 104 and the inverter module 102 are mounted or embedded on a printed circuit board (PCB) which is not shown in FIG. 1 for purposes of brevity and clarity. The output voltage line 110 is a conductive pathway or trace which can be formed by removing, e.g., by etching, an unwanted metal layer on the PCB, or by adding a trace to a substrate of the PCB. The metal foil 112 can be formed on the PCB in a similar way during the same manufacturing process of the output voltage line 110. In one embodiment, the material of the metal foil 112 can be copper.

Furthermore, the metal foil 112 can be formed as a rectangular metal foil with one side in parallel with the output voltage line 110, in one embodiment. An electric field can be generated between the metal foil 112 and the output voltage line 110 when the output voltage VOUT is generated on the output voltage line 110. As a result, the metal foil 112 and the output voltage line 110 together can form a capacitive component having a first capacitance. The capacitor 118 has a second capacitance. In this instance, a voltage can be generated across the metal foil 112 and the output voltage line 110. Furthermore, the combination of the output voltage line 110, the metal foil 112 and the capacitor 118 functions as two capacitors connected in series and divides the output voltage VOUT on the output voltage line 110 to the divided output voltage according to a ratio between the first capacitance and the second capacitance. The divided output voltage can be sensed at node 126. As such, the combination of the output voltage line 110, the metal foil 112 and the voltage divider 130 constitutes a capacitance divider. In one embodiment, the divided output voltage can be proportional to the output voltage VOUT according to the ratio between the first capacitance and the second capacitance. Furthermore, the material, the length and width of the metal foil 112, the distance between the metal foil 112 and the output voltage line 110 can be varied as long as the functionality of the capacitive component formed by the combination of the output voltage line 110 and the metal foil 112 is satisfied, in one embodiment.

Advantageously, the cost of the voltage divider 130 can be much lower than the expensive conventional high-voltage capacitance divider. Since the capacitive component formed by the output voltage line 110 and the metal foil 112 can have a relatively low capacitance, a leakage current caused by the capacitive component can be reduced. As such, current stability of the power system 100 can be improved. Moreover, a high temperature which may be caused by the conventional high-voltage capacitance divider can be avoided. As a result, the power system 100 can function stably.

In one embodiment, the voltage rectifier 132 includes a diode 114, a smoothing capacitor 120, and a resistor 124. The diode 114 is coupled between resistors 122 and 124. The smoothing capacitor 120 is coupled in parallel with the resistor 124. The diode 114 cooperating with resistors 122 and 124 rectifies the divided output voltage. The smoothing capacitor 120 filters the rectified divided output voltage and generates the sensing voltage VSEN at node 128. The sensing voltage VSEN can be fed back to the inverter module 102. The sensing voltage VSEN can represent the output voltage VOUT and can be low enough for being sensed by the inverter module 102 safely. The output voltage VOUT can be regulated or controlled by the inverter module 102 according to the sensing voltage VSEN. As such, an over-voltage protection of the power system 100 is achieved.

Furthermore, the output voltage line 110 and the metal foil 112 can be manufactured on a single layer of a PCB. As such, the power system 100 can be manufactured on a single-sided PCB board which is a relatively low-cost type of PCB boards. Moreover, the voltage sensing circuit 106 can ensure that the inverter module 102 monitors the output voltage VOUT in a safe way. The cost of the voltage sensing circuit 106 is relatively low and the voltage sensing circuit 106 can function stably.

Figure 2:
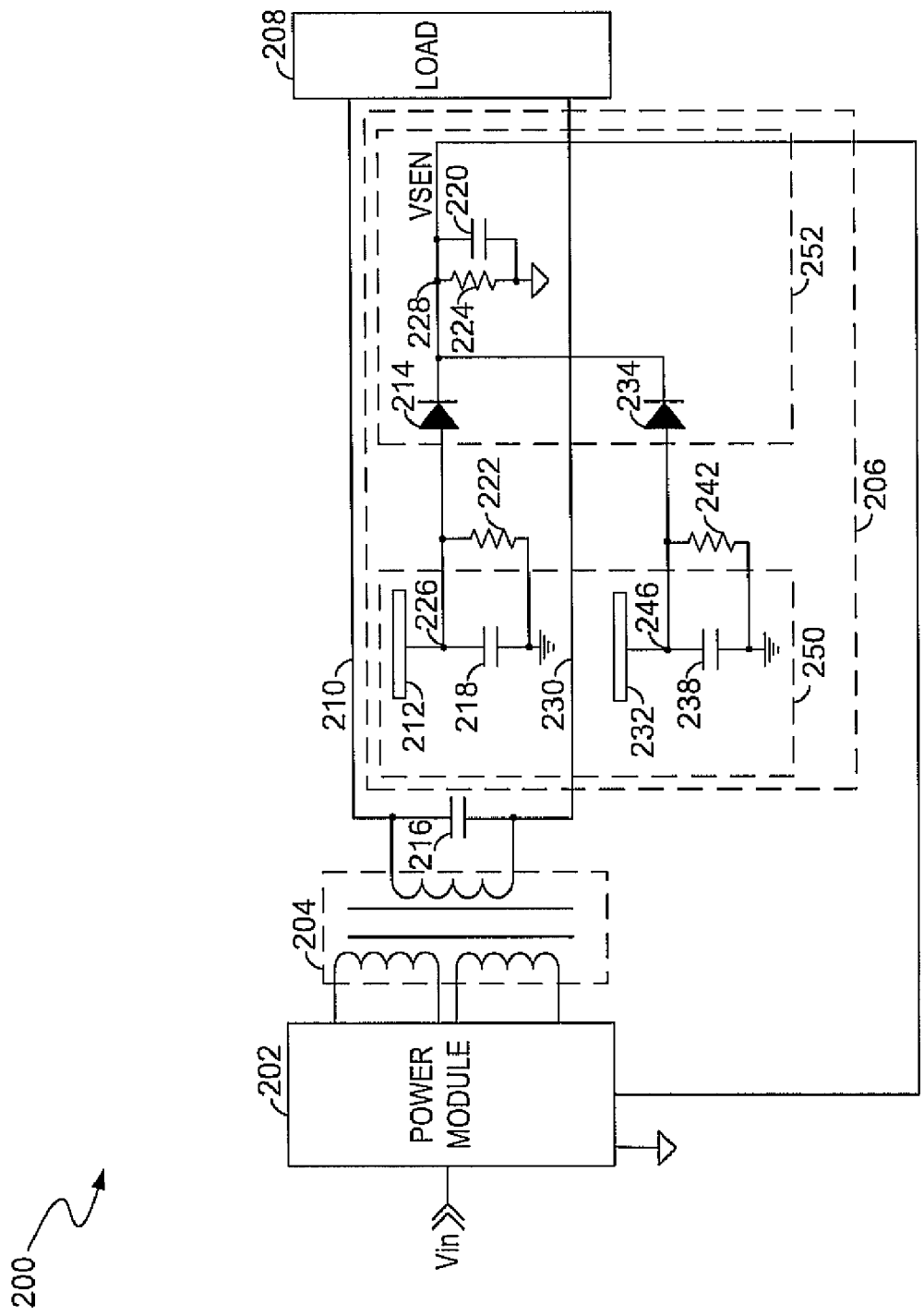
FIG. 2 is a schematic diagram of a power system according to another embodiment of the present invention.

FIG. 2 illustrates a power system 200 according to another embodiment of the present invention. For purposes of brevity and clarity, elements of the power system 200 similar to those of the power system 100 are designated as similar reference numbers and will not be described hereinafter in detail. The power system 200 includes an inverter module 202, a transformer 204, a voltage sensing circuit 206, a load 208, output voltage lines 210 and 230, and a capacitor 216, in one embodiment. The voltage sensing circuit 206 includes a voltage divider 250, a voltage rectifier 252, and resistors 222 and 242, in one embodiment. Since the power system 200 has two output voltage lines 210 and 230, the voltage divider 250 includes metal foils 212 and 232, and capacitors 218 and 238 correspondingly. The metal foils 212 and 232 are placed in parallel with the output voltage lines 210 and 230 respectively. The capacitors 218 and 238 are connected to the metal foils 212 and 232 respectively. The resistors 222 and 242 are coupled in parallel with the capacitors 218 and 238 respectively. The voltage rectifier 252 includes diodes 214 and 234, a smoothing capacitor 220, and a resistor 224. The diodes 214 and 234 are coupled to the resistors 222 and 242 respectively, and are both coupled to the resistor 224. The smoothing capacitor 220 is coupled in parallel with the resistor 224.

Two output voltages can be generated respectively on the output voltage line 210 and the output voltage line 230 with a 180 degree phase shift relative to each other so as to drive the load 208, e.g., a CCFL. The metal foil 212 and the output voltage line 210 can form a first capacitive component having a first capacitance. The capacitor 218 has a second capacitance. The first capacitive component and the capacitor 218 are coupled in series and can divide the output voltage at the output voltage line 210 to a first divided output voltage according to a ratio between the first capacitance and the second capacitance. The first divided output voltage can be sensed at node 226. Similarly, the metal foil 232 and the output voltage line 230 can form a second capacitive component having a third capacitance. The capacitor 238 has a fourth capacitance. The second capacitive component and the capacitor 238 are coupled in series and can divide the output voltage at the output voltage line 230 to a second divided output voltage according to a ratio between the third capacitance and the fourth capacitance. The second divided output voltage can be sensed at node 246.

The first divided output and the second divided output voltage can be proportional to the output voltage on the output voltage line 210 and the output voltage on the output voltage line 230 respectively, in one embodiment. Furthermore, the diode 214 and the diode 234 cooperating with the resistors 222, 242, and 224 rectify the first divided output voltage and the second divided output voltage and combine them together. The smoothing capacitor 220 filters the combined divided output voltage and generates a sensing voltage VSEN at node 228. The sensing voltage VSEN can be fed back to the inverter module 202. The sensing voltage VSEN can represent the output voltages on the output voltage line 210 and the output voltage line 230. As such, the sensing voltage VSEN can be proportional to the total level of the output voltages provided to the load 208, in one embodiment. Furthermore, the sensing voltage VSEN can be low enough for being sensed by the inverter module 202 safely. The output voltages at the output voltage line 210 and the output voltage line 230 can be regulated or controlled by the inverter module 202 according to the sensing voltage VSEN. As such, an over-voltage protection of the power system 200 is achieved. Similarly, the output voltage lines 210 and 230, and the metal foils 212 and 232 can be manufactured on a single layer of a PCB or on a single-sided PCB board.

Figure 3:
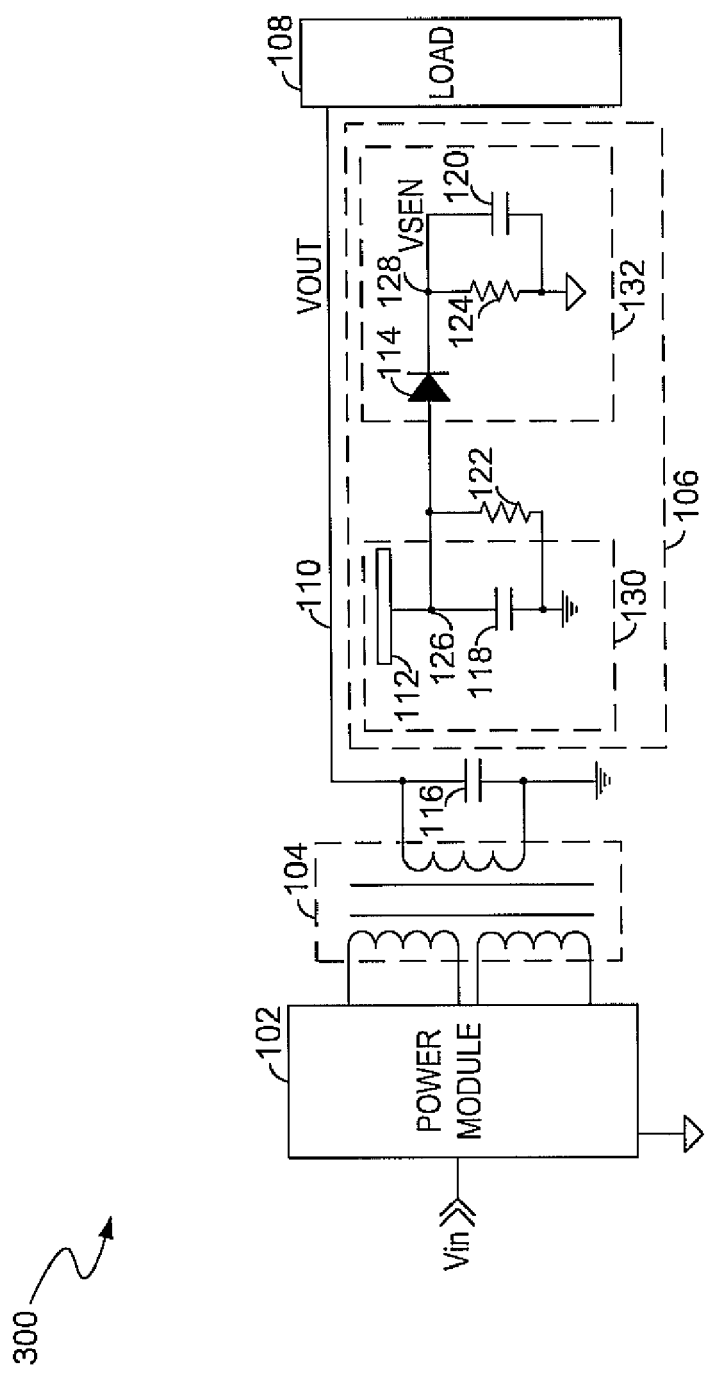
FIG. 3 is a schematic diagram of a testing circuit of a power system according to one embodiment of the present invention.

FIG. 3 illustrates a schematic diagram of a testing circuit 300 of a power system according to one embodiment of the present invention. Elements labeled the same in FIG. 1 have similar functions and will not be repetitively described herein for purposes of brevity and clarity. The testing circuit 300 is similar to the power system 100 shown in FIG. 1. The sensing voltage, VSEN, is herein coupled to a testing probe (not shown in FIG. 3 for purposes of brevity and clarity) for testing purposes, rather than being coupled to the inverter module 102.

In one embodiment, the metal foil 112 is a rectangular copper foil, and the length and width of the metal foil 112 are 10 mm and 2 mm respectively. The distance between the metal foil 112 and the output voltage line 110 can be 6 mm. The resistance of resistors 122 and 124 can be 30 kilo ohm (kΩ) and 1 mega ohm (MΩ) respectively. The capacitance of capacitors 118 and 120 can be 270 pico farad (pF) and 10 nano farad (nF) respectively.

In the testing process, the input voltage Vin of the inverter module 102 varies, and the output voltage VOUT varies accordingly. The sensing voltage VSEN can be measured at node 128. An exemplary experimental testing result is shown in Table-1 as follows. Table-1 illustrates voltage values of the output voltage VOUT, voltage values of the corresponding sensing voltage VSEN, and the ratios of the output voltages VOUT to the sensing voltages VSEN. The voltage values are calculated in root mean square (RMS) form so that the voltage values are not affected by the signs of their quantities, in one embodiment. It can be observed that when the voltage values of the output voltage VOUT is 2.24 kilovolt (kV), 1.73 kV, 1.57 kV, 1.28 kV, and 1.11 kV, the voltage value of the sensing voltage VSEN is 2.69 volt (V), 2.03V, 1.75V, 1.38V, and 1.16V correspondingly. The corresponding ratio of the output voltage VOUT to the sensing voltage VSEN is 0.833 k, 0.852 k, 0.897 k, 0.928 k, and 0.957 k respectively.

TABLE 1

| output voltage VOUT (kV) | 2.24 | 1.73 | 1.57 | 1.28 | 1.11 |
|---|---|---|---|---|---|
| sensing voltage VSEN (V) | 2.69 | 2.03 | 1.75 | 1.38 | 1.16 |
| Ratio (k) | 0.833 | 0.852 | 0.897 | 0.928 | 0.957 |

Figure 4:
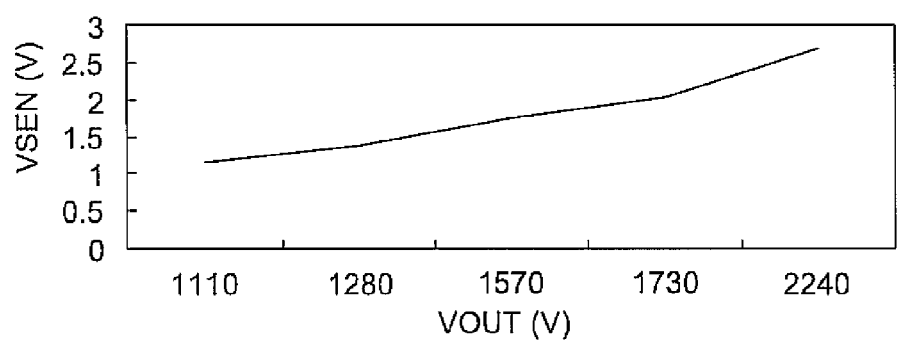
FIG. 4 is an exemplary plot illustrating voltage values of a sensing voltage versus voltage values of an output voltage according to the testing circuit in FIG. 3.

FIG. 4 is an exemplary plot 400 illustrating the sensing voltage versus the output voltage according to one experimental testing result of the testing circuit 300 shown in FIG. 3. As shown in Table-1 and FIG. 4, the sensing voltage VSEN varies in response to the output voltage VOUT. In the testing process, a waveform of the divided output voltage can reflect an undulation of a waveform of the output voltage VOUT. As shown in the exemplary plot 400, a waveform of the sensing voltage VSEN varies according to the RMS value of the output voltage VOUT. Furthermore, the voltage values of the sensing voltage VSEN can be low enough for the inverter module to sense safely.

Furthermore, an experimental voltage regulation testing is proceeded in the power system 100 in FIG. 1. During the voltage regulation testing, the input voltage Vin sent to the inverter module 102 of the power system 100 varies and the corresponding output voltage VOUT provided to the load 108 is measured. An exemplary result of the voltage regulation testing is shown in Table-2. Table-2 illustrates the voltage values of the input voltage Vin and the voltage values of the corresponding output voltage VOUT.

TABLE 2

| Input voltage Vin (V) | 14 | 15 | 16 | 17 | 18 | 19 | 20 | 21 | 22 | 23 | 24 | 25 |
|---|---|---|---|---|---|---|---|---|---|---|---|---|
| Output voltage VOUT (KV) | 1.91 | 1.92 | 1.88 | 1.90 | 1.89 | 1.88 | 1.88 | 1.87 | 1.88 | 1.88 | 1.87 | 1.87 |

As shown in Table-2, while the input voltage Vin is varied from 14V to 25V, the voltage value of the output voltage VOUT is 1.91 KV, 1.92 KV, 1.88 KV, 1.90 KV, 1.89 KV, 1.88 KV, 1.87 KV, 1.88 KV, 1.87 KV, and 1.87 KV correspondingly, which clamps around 1.9 KV. The result of the voltage regulation testing shows that the power system 100 as well as the inverter module 102 can operate properly and stably.

Figure 5:
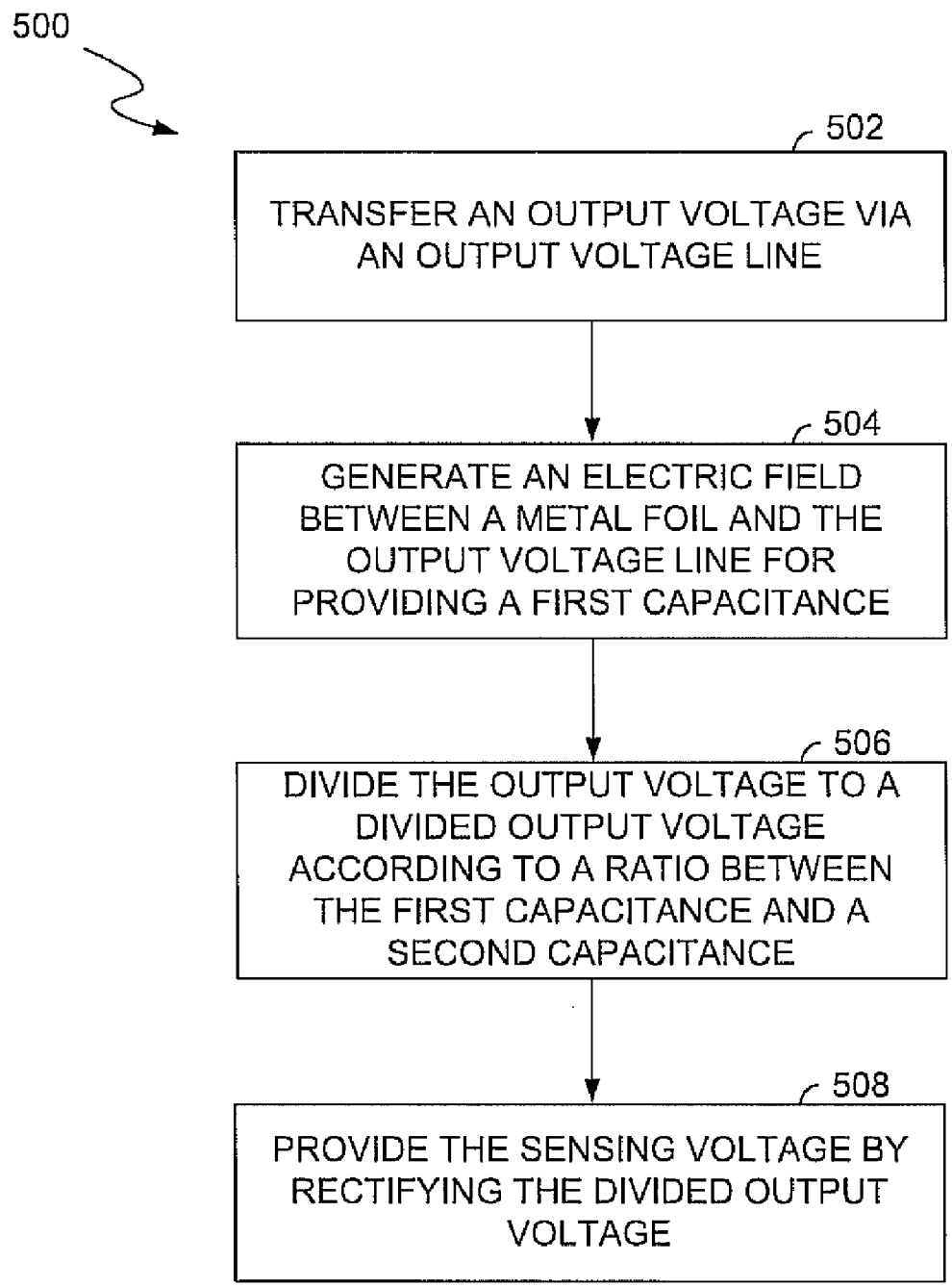
FIG. 5 is a flowchart of a method for sensing an output voltage of a power system according to one embodiment of the present invention.

FIG. 5 illustrates a flowchart of a method for sensing an output voltage of a power system according to one embodiment of the present invention. Although specific steps are disclosed in FIG. 5, such steps are exemplary. That is, the present invention is well suited to performing various other steps or variations of the steps recited in FIG. 5. FIG. 5 is described in combination with FIG. 1.

In block 502, an output voltage is transferred via an output voltage line. In one embodiment, the output voltage VOUT is transferred via the output voltage line 110.

In block 504, an electric field is generated between a metal foil and the output voltage line for providing a first capacitance. In one embodiment, the electric field can be generated between the metal foil 112 and the output voltage line 110 when the output voltage VOUT is generated on the output voltage line 110. As a result, the metal foil 112 and the output voltage line 110 together form a capacitive component having the first capacitance.

In block 506, the output voltage is divided to a divided output voltage according to a ratio between the first capacitance and a second capacitance. In one embodiment, the combination of the output voltage line 110 and the metal foil 112 together with a capacitor 118 functions as two capacitors connected in series and divides the output voltage VOUT on the output voltage line 110 to the divided output voltage according to the ratio between the first capacitance and the second capacitance of the capacitor 118.

In block 508, a sensing voltage is generated by rectifying the divided output voltage. In one embodiment, a voltage rectifier 132 rectifies the divided output voltage to generate the sensing voltage VSEN.

Accordingly, embodiments according to the present invention provide a voltage sensing circuit which can provide a sensing voltage in a relatively low-cost and effective way. Also, the voltage sensing circuit can improve current stability and can avoid crisis situations, e.g., a high temperature situation in a power system. Furthermore, the voltage sensing circuit can be manufactured on a single-sided PCB board. The voltage sensing circuit is not limited in the application of CCFL inverter systems, and can also be used in many other power applications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. An inverter circuit comprising:
   a power module for providing a driving power;
   a transformer coupled to said power module for converting said driving power to a power having a first voltage;
   a first line coupled to said transformer for delivering said power having said first voltage to a load;
   a metal foil for forming a first capacitor with said first line; and
   a second capacitor coupled to said first capacitor for generating a sensing voltage indicative of said first voltage.

2. The inverter circuit of claim 1, wherein said sensing voltage is fed back to said power module for regulating said first voltage.

3. The inverter circuit of claim 1, wherein said first capacitor and said second capacitor are coupled in series.

4. The inverter circuit of claim 1, wherein a ratio of said sensing voltage to said first voltage is determined by capacitances of said first and second capacitors.

5. The inverter circuit of claim 1, further comprising:
   a voltage rectifier coupled to said first and second capacitors for rectifying said sensing voltage.

6. The inverter circuit of claim 1, wherein said metal foil is placed in parallel with said first line.

7. The inverter circuit of claim 1, wherein said load comprises a cold cathode fluorescent lamp.

8. The inverter circuit of claim 1, wherein said metal foil comprises a copper foil.

9. A method comprising:
   transferring a first voltage via a first line;
   producing a first capacitance by said first line and a metal foil;
   producing a second capacitance by a second capacitor; and
   generating a sensing voltage indicative of said first voltage according to said first and second capacitances.

10. The method of claim 9, further comprising:
    generating a divided voltage based on said first voltage at a junction node of said metal foil and said second capacitor; and
    rectifying said divided voltage to generate said sensing voltage.

11. The method of claim 9, further comprising:
    providing a driving power by a power module;
    converting said driving power to a power having said first voltage; and
    delivering said power having said first voltage to a cold cathode fluorescent lamp.

12. The method of claim 11, further comprising:
    feeding said sensing voltage back to said power module; and
    regulating said first voltage based on said sensing voltage.

13. The method of claim 9, wherein a ratio of said sensing voltage to said first voltage is determined by said first and second capacitances.

14. A system comprising:
    a power module for providing a first voltage;
    a first line coupled to said power module and operable for transferring said first voltage to a load; and
    a voltage sensing circuit coupled to said power module and operable for generating a sensing voltage indicative of said first voltage, said voltage sensing circuit comprising a metal foil operable for forming a first capacitor with said first line.

15. The system of claim 14, wherein said sensing voltage is fed back to said power module for regulating said first voltage.

16. The system of claim 14, wherein said voltage sensing circuit further comprises a second capacitor coupled to said first capacitor in series.

17. The system of claim 16, wherein a ratio of said sensing voltage to said first voltage is determined by capacitances of said first and second capacitors.

18. The system of claim 14, wherein said load comprises a cold cathode fluorescent lamp.

19. The system of claim 14, wherein said power module comprises an inverter.

20. The system of claim 14, wherein said metal foil comprises a copper foil.

* * * * *